United States Patent
Atallah et al.

(10) Patent No.: US 6,577,202 B1
(45) Date of Patent: Jun. 10, 2003

(54) MULTIPLE DUTY CYCLE TAP POINTS FOR A PRECISE AND PROGRAMMABLE DUTY CYCLE GENERATOR

(75) Inventors: Francois I. Atallah, Raleigh, NC (US); Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/020,533

(22) Filed: Dec. 14, 2001

(51) Int. Cl.⁷ .......................... H03B 27/00; H03K 3/017
(52) U.S. Cl. .......................................... 331/57; 327/175
(58) Field of Search ............................ 331/57; 327/155, 327/159, 172, 175, 176, 261, 263, 264, 269–277, 285

(56) References Cited

U.S. PATENT DOCUMENTS

| 4,414,637 A | 11/1983 | Stanley |
| 4,482,826 A | 11/1984 | Ems et al. |
| 4,881,041 A | 11/1989 | Kawanabe et al. |
| 5,157,277 A | 10/1992 | Tran et al. |
| 5,231,320 A | 7/1993 | Kase |
| 5,302,920 A | 4/1994 | Bitting |
| 5,349,311 A | 9/1994 | Mentzer |
| 5,394,114 A | 2/1995 | Davis |
| 5,406,590 A | 4/1995 | Miller et al. |
| 5,451,893 A | 9/1995 | Anderson |
| 5,563,605 A | 10/1996 | McEwan |
| 5,903,747 A | 5/1999 | Casal |
| 5,923,200 A | 7/1999 | Shimizume |
| 5,933,039 A | 8/1999 | Hui et al. |
| 5,949,292 A | 9/1999 | Fahrenbruch et al. |
| 6,028,491 A | 2/2000 | Stanchak et al. |
| 6,509,771 B1 * | 1/2003 | Atallah et al. ............... 327/175 |

FOREIGN PATENT DOCUMENTS

JP          4000910          1/1992

* cited by examiner

Primary Examiner—David C. Mis
(74) Attorney, Agent, or Firm—Scully, Scott, Murphy & Presser, P.C.; Scott W. Reid

(57) ABSTRACT

A precise programmable duty cycle generator employs multiple duty cycle generators connected in series to provide multiple duty cycle tap point outputs, each with a known and precise value of a duty cycle from a source input signal having any duty cycle. The present invention transforms an incoming signal's duty cycle to a known value by a first programmable duty cycle generator, and then applies the output of the first programmable duty cycle generator to a second programmable duty cycle generator which provides multiple duty cycle tap point outputs, each having a different known value of a precise duty cycle.

14 Claims, 4 Drawing Sheets

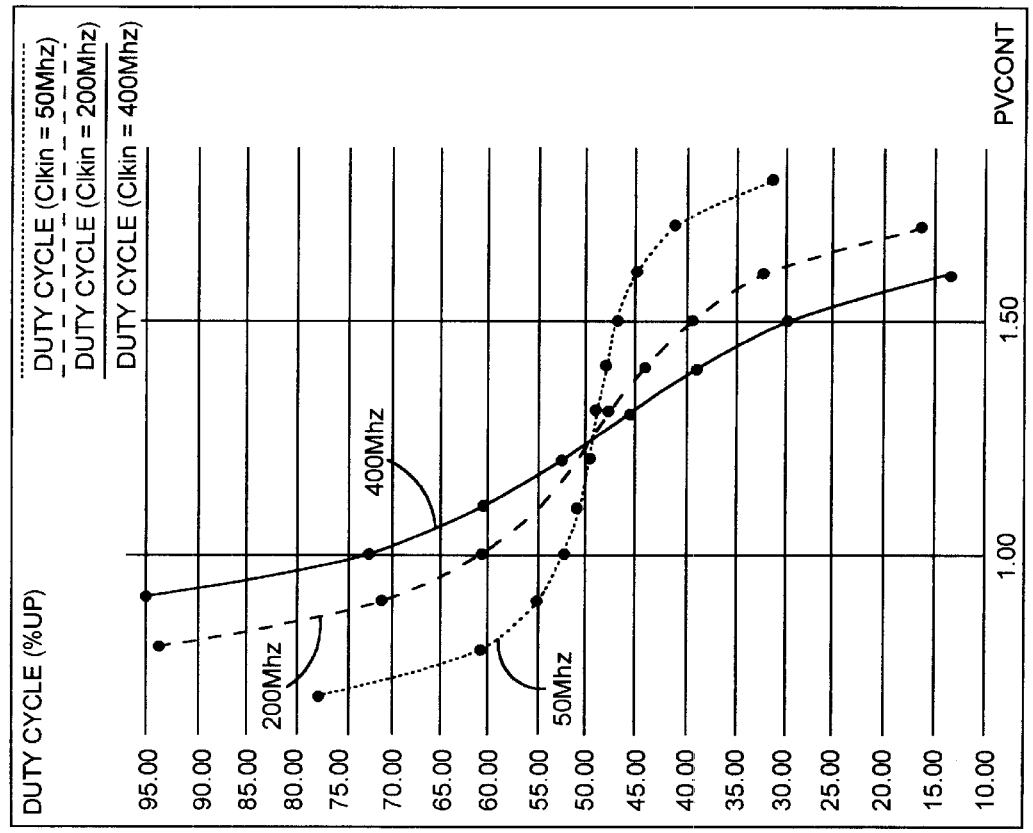
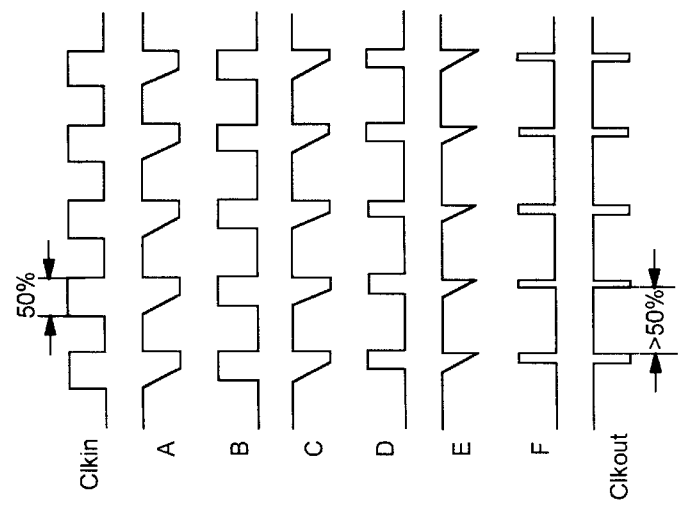

MULTIPLE DUTY CYCLE TAP POINTS FOR A PRECISE AND PROGRAMMABLE DUTY CYCLE GENERATOR

BACKGROUND OF THE INVENTION

1. Field of the Invention

The present invention relates generally to multiple duty cycle tap points for a precise and programmable duty cycle generator, and more particularly pertains to the provision of a precise and programmable duty cycle generator which employs multiple duty cycle generators connected in series to provide multiple duty cycle tap point outputs, each with a known and precise value from a source input signal having any duty cycle.

Almost all ICs require a clock signal to accomplish their operations and be synchronous with other related components. The frequency of this clock determines the performance of the IC. As sub-micron technologies allow designs to operate at higher frequencies, design techniques must also provide for increasing their performance. An adjustable duty cycle clock circuit provides designers with flexibility in their designs, allowing them to meet high-performance and low-power goals. In addition to this flexibility, a programmable duty cycle adjuster provides robustness to the design. After fabrication, if the process was not modeled accurately, the duty cycle can be adjusted through the IC bus, fuses, or primary pins on the IC to operate the IC at the highest possible clock rate.

A prior disclosure, filed as U.S. patent application Ser. No. 10/020,528, on even date herewith, and titled, "A Precise And Programmable Duty Cycle Generator", is hereby expressly incorporated by reference herein and describes a circuit to generate/create a user definable duty cycle with precision from an input signal having any duty cycle, and is described with reference to FIGS. 1–5 herein. As explained in that disclosure, for a fixed number of delay stages the range of duty cycle selection is inversely proportional to the frequency of the signal at CLKIN.

A prior disclosure, filed as U.S. patent application Ser. No. 10/017,071, on even date herewith, and entitled "Enhanced Operational Frequency for a Precise and Programmable Duty Cycle Generator", is hereby expressly incorporated by reference herein and describes a means to further enhance the operation frequency range and precision of the previously disclosed circuit configuration for producing a user definable duty cycle with precision. That scheme allows the precise and programmable duty cycle circuit to support a wider range of frequencies and duty cycle sensitivities which are now selectable. Applications wherein the incoming frequency is variable or selectable can readily employ this approach and have the desired output duty cycle without loss of precision.

Pursuant to the present invention, the frequency range limitation based on the frequency of the input clock signal at CLKIN can be alleviated by designing the VCDCG with a broad number of delay taps in conjunction with multiple tap points which are multiplexed at the output.

2. Discussion of the Prior Art

The idea of providing a circuit for duty cycle correction isn't new. The prior art has circuits which correct an incoming signal's duty cycle to a fixed value, typically 50-50. The present invention differs from the prior art by allowing the output corrected signal to be programmable to any value duty cycle with precision.

Most prior art circuits provide only 50/50 duty cycles without the ability to provide other duty cycles. U.S. Pat. No. 4,881,041 discloses a circuit to correct an incoming signal's duty cycle to a 50/50 duty cycle, and is limited to a 50/50 duty cycle correction with no provision for any other duty cycle, and the circuit is completely different from the present invention. U.S. Pat. No. 5,157,277 discloses a circuit to convert a sine wave input clock signal at a 50/50 duty cycle into a square wave signal with a variable duty cycle. The conversion circuit is limited to sine wave inputs, and is significantly different from the present invention which addresses square wave signals.

SUMMARY OF THE INVENTION

Accordingly, it is a primary object of the present invention to provide an enhanced operational frequency for a precise programmable duty cycle generator which employs multiple duty cycle generators connected in series to provide multiple duty cycle tap point outputs, each with a known and precise value of a duty cycle from a source input signal having any duty cycle.

The present invention transforms an incoming signal's duty cycle to a known value by a first programmable duty cycle generator, and then applies the output of the first programmable duty cycle generator to a second programmable duty cycle generator which provides multiple duty cycle tap point outputs, each having a different known value of a precise duty cycle.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which:

FIG. 3 illustrates a timing diagram for a 3-stage VCDCG for the case where a longer uptime is desired.

FIG. 4 shows the DUTY CYCLE (%) for a 50 Mhz, 200 Mhz, and a 400 Mhz input clock versus VCONT for a fixed chain length.

DETAILED DESCRIPTION OF THE INVENTION

High Level Overview

A programmable duty cycle generator circuit is comprised of:

(i) a set of register bits holding the digitally encoded duty cycle data;
(ii) an n-bit Digital-to-Analog Converter (DAC) used to convert the digitally encoded desired duty cycle into an analog voltage;
(iii) an Operational Transconductance Amplifier (OTA) used to compare the analog voltage representing the desired duty cycle with an analog feedback voltage;
(iv) a Voltage Controlled Duty Cycle Generator (VCDCG) which generates the desired duty cycle; and
(v) a Low Pass Filter (LPF) which generates an analog voltage which is the feedback signal fed to the OTA thereby providing the closed loop operation.

Figure 1:
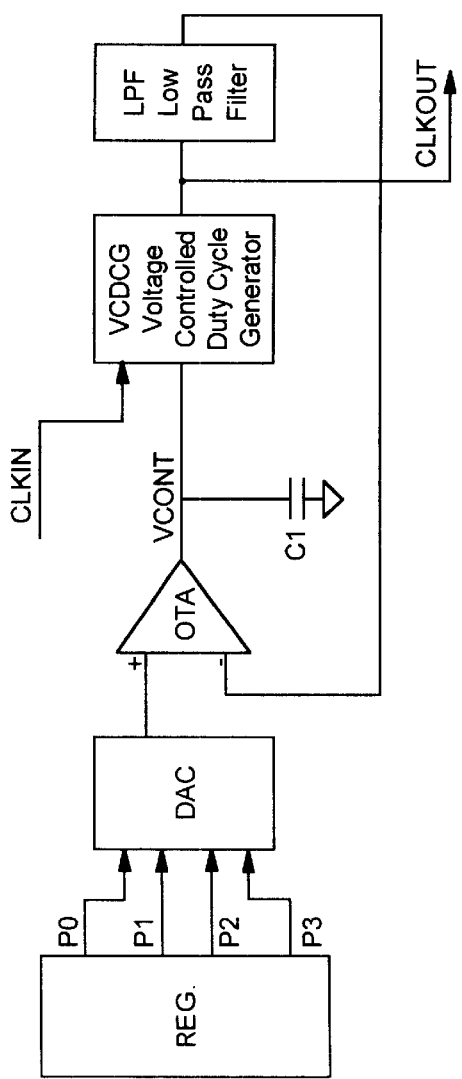
FIG. 1 is a block diagram of a single-ended programmable duty cycle correction circuit.

The inputs to the VCDCG are an input clock signal and the output of the OTA. The output of the VCDCG is the duty cycle corrected clock. FIG. 1 illustrates this basic configuration in a block diagram of one embodiment of a single-ended programmable duty cycle generator circuit. The programmable duty cycle generator circuit of FIG. 1 represents a single-ended implementation. A differential implementation which has higher noise immunity can be employed using the teachings of this disclosure and known differential techniques, and is discussed in greater detail in U.S. Patent Application filed as Ser. No. 10/020,528, on even date herewith, and titled "A Precise And Programmable Duty Cycle Generator".

The Low Pass Filter (LPF) is the duty cycle measuring circuit whose output voltage is subtracted in the Operational Transconductance Amplifier (OTA) from a reference voltage generated from the DAC whose inputs, P0 through P3, set the equivalent DC voltage associated with the duty cycle desired. In this illustration, four inputs, P0–P3, define the encoded desired duty cycle. The OTA (Operational Transconductance Amplifier) generates a current that is proportional to the difference of its input voltages. If the two voltages are equal, then no current will charge or discharge the capacitor C1 leading to a DC voltage at VCONT that forces the waveform at CLKOUT to be equal to the desired duty cycle. On the other hand, if the duty cycle at CLKOUT is less than the desired duty cycle, then the output of the Low Pass Filter will be smaller than the output of the DAC. The OTA will generate a current proportional to the difference between the output of the DAC and the output of the Low Pass Filter. The current will charge the capacitor causing VCONT to rise and the duty cycle at CLKOUT to increase. The mechanism is the same but in the other direction if the duty cycle of CLKOUT is greater than the desired duty cycle. Note that the Voltage Controlled Duty Cycle Generator (VCDCG) inverts CLKIN. If a non-inverting signal is desired, the output of the DAC and the output of the Low Pass Filter should be swapped going into the OTA.

FIG. 1 illustrates a generic embodiment of a programmable duty cycle generator. The register and the DAC provide the programmable function to the duty cycle generator, and function to generate a programmable DC voltage representative of the desired duty cycle. A nonprogrammable embodiment of a duty cycle generator might substitute a fixed DC voltage input to the OTA.

Figure 2:
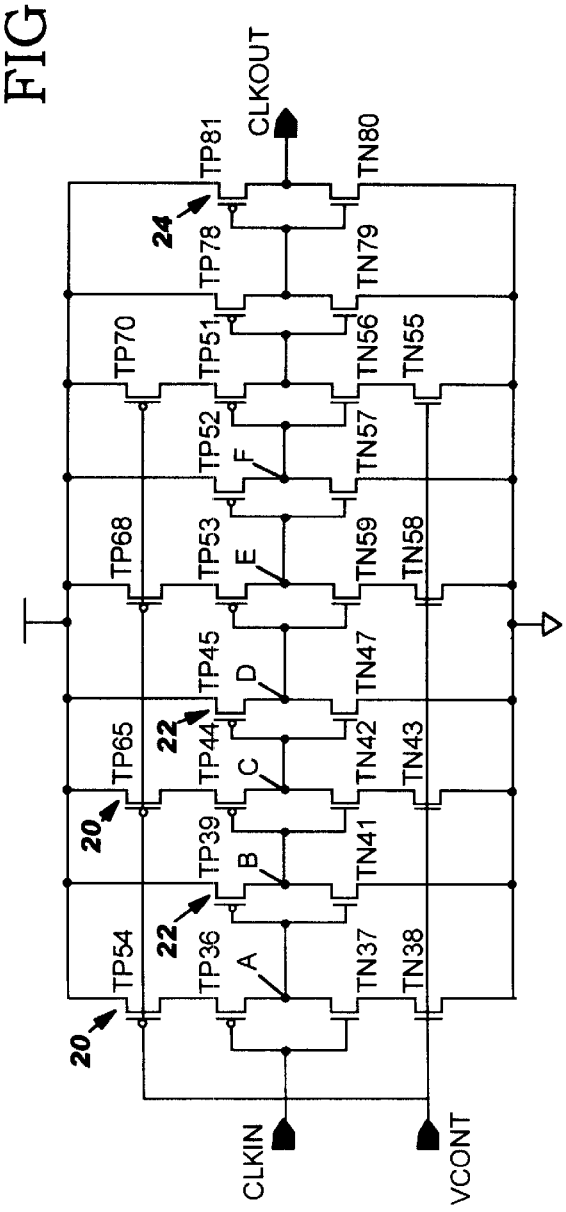
FIG. 2 illustrates a Voltage Controlled Duty Cycle Generator (VCDCG) which is a very important aspect of the present invention.

FIG. 2 illustrates an embodiment of a Voltage Controlled Duty Cycle Generator (VCDCG) which is a very important aspect of the present invention.

The Voltage Controlled Duty Cycle Generator is comprised of a plurality of current starved inverters 20, each of which comprises 2 PFETs: The top PFET (e.g. TP54 in stage 1) serves as a current source while the second PFET (e.g. TP36 in stage 1) in series serves a switch, and 2NFETs: The bottom NFET (e.g. TN38 in stage 1) serves as a current source while the second NFET (e.g. TN37 in stage 1) in series serves as a switch. These are followed by a series inverter 22 which presents a capacitive load to the current sources, to provide either additive or subtractive duty cycle corrections. The plurality of current starved inverters are controlled by the output control signal voltage VCONT of the operational amplifier which is connected to both the PFET current sources and the NFET current sources. The multiple stages of 20–22 are followed by a final conventional inverter 24 to provide a desired polarity clock pulse. The conventional inverter 24 can be omitted to provide opposite polarity clock pulses.

Unlike a conventional current starved inverter, the VCONT signal is connected to both the PFET current sources (TP64, TP66, TP68, or TP70) as well as the NFET current sources (TN38, TN43, TN58, or TN55). As the voltage at VCONT increases, the PFET current source will provide a smaller current to charge the capacitive load of the series inverter 22, and the NFET current source will provide a larger current to discharge the capacitive load of the series inverter 22. Therefore, at the output of each current starved inverter 20 the waveform has a slow rising edge and a fast falling edge. Because of the difference in edge rates, the output of each CMOS inverter 22 will have a longer falling delay (tphl) than the rising delay (tplh). This difference in delays produces a duty cycle correction that is controlled by VCONT. This mode of operation is reversed when the voltage at VCONT decreases.

FIG. 3 illustrates a timing diagram for a 3-stage VCDCG for the case where a longer uptime is desired, wherein the waveforms A–F correspond to the nodes A–F of FIG. 2. As can be seen, the falling transitions associated with the output stages of the current starved inverters (nodes A, C and E) is 'slow' and rising transitions are crisp. The inverters following the current starved inverters invert the signals and provide crisp edges. Note however, that the pulse widths have been reduced and continue to be reduced as the signals propagate down the line. The final inverter 24 in the VCDCG reshapes the signal with crisp edges and supports the needed output drive, polarity and phase.

Note that while this VCDCG circuit may appear similar to a voltage controlled delay line (VCDL), it is quite a bit different. Typically in a VCDL all the elements are current starved inverters with the possible exception of the output driving section. The goal in a VCDL is to control delay, not duty cycle. In fact, the duty cycle within a VCDL is kept relatively constant There are generally two voltage controls used within the VCDL; one for the PFETS, VCONTP, and another for the NFETS, VCONTN. To increase delay, the VCONTP is increased towards the power supply level whereas the VCONTN is decreased towards ground. In essence, the applied control voltages are moving in opposite directions. In contrast, the VCDCG employs a current starved inverter which is immediately followed by a conventional inverter to allow duty cycle corrections to be either additive or subtractive. Also, this circuit is unlike voltage controlled delay lines in that the current starved inverters are controlled by a single voltage, Vcont, and the series inverter isn't voltage controlled at all. The single control voltage causes the current starved inverter's delay to degrade/improve on one transition while improve/degrade on the other transition.

The number of stages needed depends on the frequency of the CLKIN signal and the desired voltage range at the VCONT terminal. For a fixed number of delay blocks, the voltage range at VCONT required to span from the minimum duty cycle to the maximum one is inversely proportional to the frequency of the signal at CLKIN. Therefore, the number of stages can be designed based on the range of expected input frequencies, the allowed voltage span at VCONT, and the desired duty cycle range of the output signal at CLKOUT.

FIG. 4 shows the DUTY CYCLE (%) for a 50 Mhz, 200 Mhz, and a 400Mhz input clock versus VCONT for a fixed chain length.

Examining the 50 MHz curve in FIG. 4 reveals that the duty cycle can be controlled from 78% down to nearly 0% by varying VCONT (the last point on the plot is 32% but by increasing VCONT a lower duty cycle can be achieved). The higher frequency operations for the same number of stages within the VCDCG allow duty cycles to range from nearly 95% down to nearly 0% over a narrower range of VCONT. The shape of the 50 MHz curve relative to the higher frequency curves clearly shows that more precision is available but at the cost of operational duty cycle breadth. Hence, the stage length can be specified for a given frequency to adjust for more precision as well as duty cycle range.

The number of stages of the VCDCG of FIGS. 1 and 2 depends on the frequency of the CLKIN signal and the desired voltage range at the VCONT terminal. For a fixed number of delay blocks, the voltage range at VCONT required to span from the desired minimum duty cycle to the desired maximum duty cycle is inversely proportional to the frequency of the signal at CLKIN. Therefore, as explained in the prior disclosure, the number of stages can be based on the range of expected frequencies, the allowed voltage span at VCONT, and the desired duty cycle range and precision of the output signal at CLKOUT. Pursuant to the present invention, this frequency range limitation can be alleviated by designing the VCDCG with a broad number of delay taps in conjunction with multiple tap points and multiplexing them at the output. The controls of the multiplexor can then select the appropriate frequency range for best duty cycle control.

Figure 5:
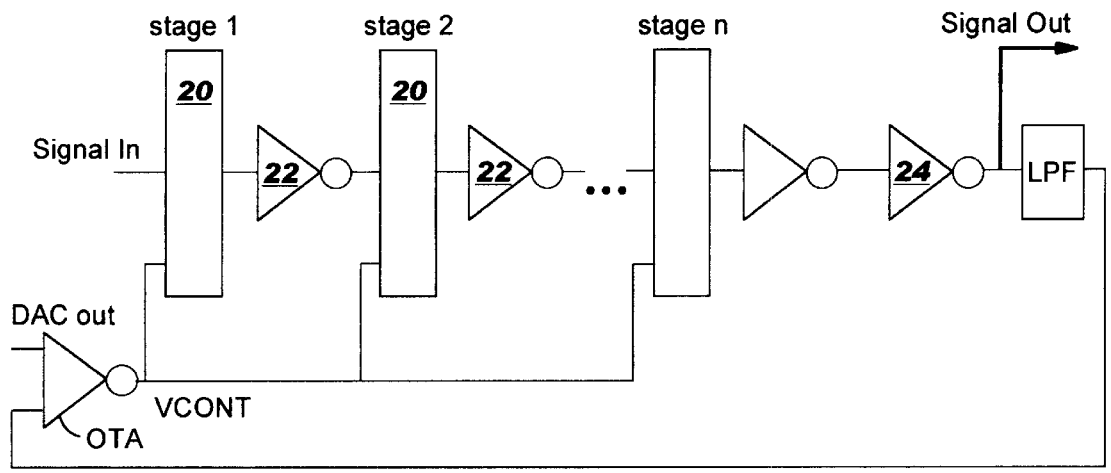
FIG. 5 represents the single-ended programmable duty cycle generator circuit of FIGS. 1 and 2 in block diagram form, wherein the VCDCG section is comprised of n-stages, each having an inverted output, and the last stage is connected to an output inverter.

FIG. 5 represents the single-ended programmable duty cycle correction circuit of FIGS. 1 and 2 in a simplified block diagram form. The VCDCG section is comprised of n-stages 20, each stage 20 having an inverter 22 at its output to provide an inverted output, and the last stage n is connected to the output inverter 24 as explained in further detail with reference to FIG. 2 in particular.

The present invention employs multiple duty cycle generators connected in series to provide multiple duty cycle tap point outputs, each with a known and precise value from a source input signal having any duty cycle. The present invention transforms an incoming signal's duty cycle to a known value by means of a first programmable duty cycle generator, and then applies the output of the first programmable duty cycle generator to a second programmable duty cycle generator which provides multiple duty cycle tap point outputs, each of known value and precision.

This provides chip designers with an option of clocking various logic elements With clocks of different, but known duty cycles for power and performance optimizations. As was explained in patent application Ser. No.09/542,189 not all paths require C1 (capture) clock gating, hence, those not needing it can have wider C1 pulses and improved data setup time. For those requiring a gated C1 clock, a tradeoff between more available time for the generation/creation of the blocking control signal and data setup time is desired and can be achieved by having unique duty cycle management.

Also, since setup is a function of the stability of the power supply, noise generated by the falling edges of C2 (launch) clock pulse in close time proximity with the narrow C1 pulse will adversely degrade the setup time. By employing a "waterfall" effect wherein the various C2 clocks fall at different times, the simultaneous switching noise will be reduced and hence will improve the setup time. This "waterfall" transitioning can be controlled by means of this programmable duty cycle correction scheme.

Also, not all sections of the chip have the same pulse width/duty cycle requirements. Normally the least common denominator approach prevails. This often results in sublevel optimization. By employing multiple concurrent duty cycle correction, each section can have its own optimized duty cycle.

Figure 6:
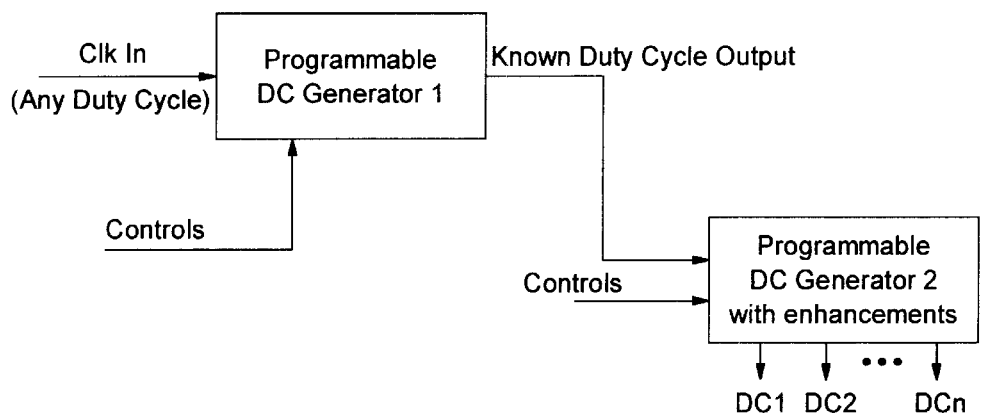
FIG. 6 illustrates the basic concept of the present invention wherein a first duty cycle generator converts an input source clock's unknown duty cycle to a known and programmable duty cycle, and a second programmable duty cycle generator is connected in series with the output of the first duty cycle generator and produces multiple outputs, DC1, DC2 . . . DCn, each with a known and precise duty cycle value.

FIG. 6 illustrates the basic concept of the present invention wherein a first duty cycle generator 1 of the type as illustrated in FIG. 1 is employed to convert an input source clock's unknown duty cycle to a known and programmable duty cycle. A second programmable duty cycle generator 2 is connected in series with the output of the first duty cycle generator 1. The second duty cycle generator 2 is a modified configuration, producing multiple outputs, DC1, DC2 . . . DCn, each with a known and precise duty cycle value.

The controls to each DC generator 1,2 are used to select the desired duty cycle at the output. For example, the controls for DC generator 1 could be set to provide a known duty cycle output of 50/50. The controls for DC generator 2 could be set to provide a final duty cycle output of 80/20. Hence, each of the n-taps of DC generator 2 would be a fraction of the difference of the incoming's signal duty cycle, 50/50 in this case, and the 80/20 final or last stage duty cycle output, such as 60/40, 70/30 and finally 80/20. Each of the DC generators could be further enhanced by the techniques outlined in U.S. Pat. No. 6,509,711 to improve the operational frequency.

Figure 7:
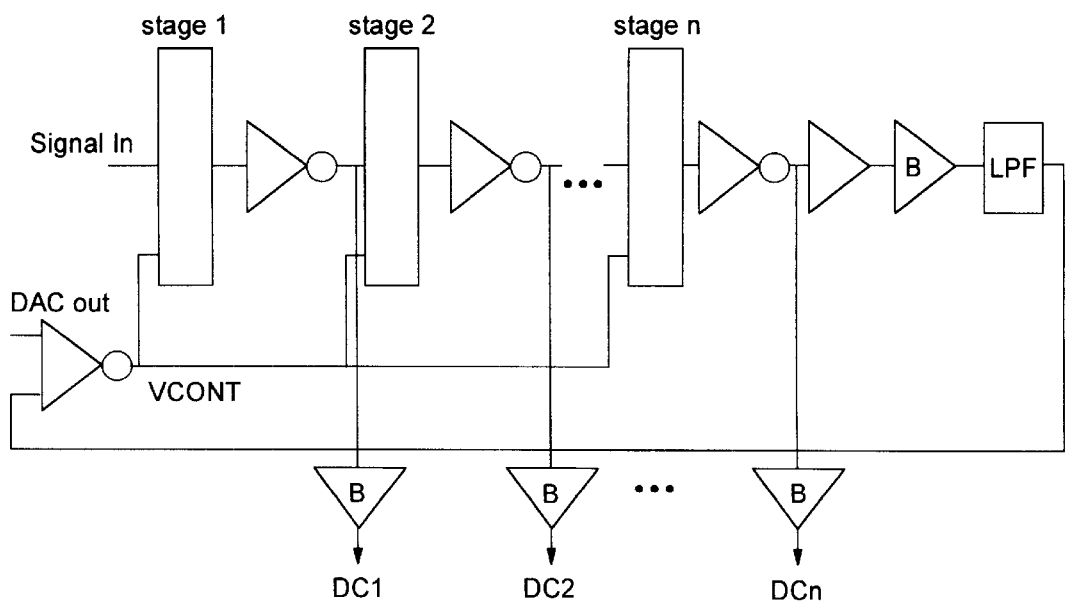
FIG. 7 illustrates the configuration of the second programmable duty cycle generator which provides a tap point output after each stage.

FIG. 7 illustrate the configuration of the second programmable duty cycle generator which is essentially the same as illustrated in FIG. 5 with the exception that tap point outputs are provided after select stages or after each stage. The inclusion of a buffer B at each tap point output isolates the output load from the internal circuit of the duty cycle generator. A duty cycle offset due to the buffer is compensated for by the insertion of a like buffer B in the loop after the last inverter in the VCDCG, before the LPF.

Figure 8:
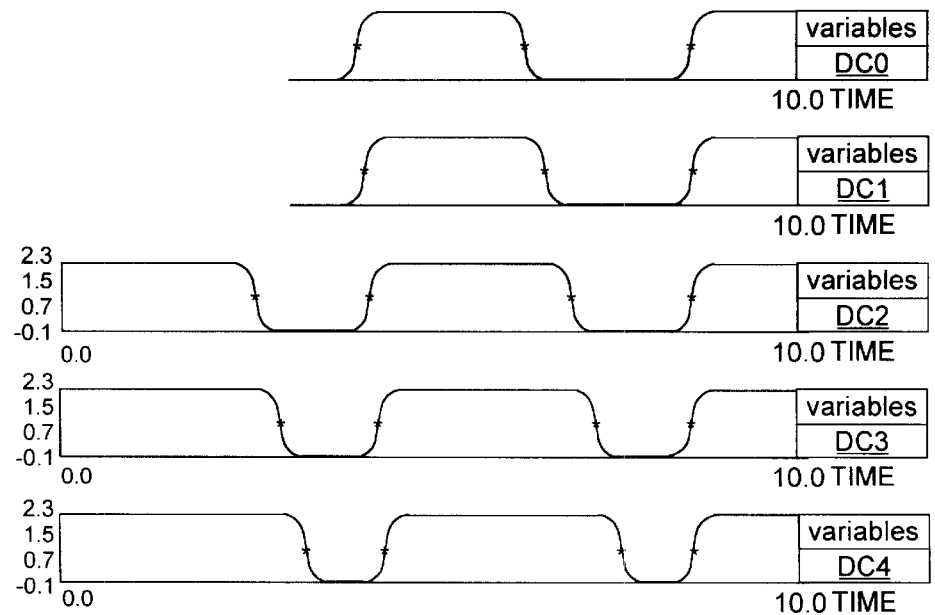
FIG. 8 illustrates timing waveforms of a 4 stage duty cycle generator with 4 tap point outputs which is driven by a primary duty cycle generator whose output is set to a 50/50 duty cycle.

FIG. 8 illustrates timing waveforms of a 4 stage duty cycle generator with 4 tap point output which is driven by a primary duty cycle generator whose output is set to 50/50. FIG. 8 illustrates the resulting waveforms for a configuration like that of FIG. 7 having four stages, each of which is available for ouptut. The input signal is from a first duty cycle generator producing a 50/50 signal DC0 (the timing diagram shows a slight skew due to simulation resulting in a 49.75/50.25 duty cycle). The output duty cycle of the last stage, DC4, of this second duty cycle generator is set to 82.94/17.06. The cycle time for this example is 50 ns. The next to the last or third output, DC3, produces a duty cycle of 74.95/25.05, whereas the second and first tap points, DC2 and DC1, produce duty cycles of 65.59/33.41 and 58.23/41.67, respectively.

The ideal duty cycle delta or increment between adjacent tap points is (82.94−50)/4=8.24. Based on this increment per stage, the first tap point should have a duty cycle of: 50+8.24=58.24/41.76. The simulation shows a duty cycle of: 58.23/41.77. Therefore the error is (58.23−58.24)/58.24=−

0.017%. If we continue down the path, the duty cycle at the second tap point is: 50+2 (8.24)=66.48/33.52. The simulation shows a duty cycle of 66.59/33.41. Therefore the error is (66.48−66.59)/66.48=−0.16%

The duty cycle at the third tap point is 50+3(8.24)=74.72/25.28. The simulation shows a duty cycle of 74.95/25.05. The error is (74.72−74.95)/74.72=−0.3%. Finally, the duty cycle at the fourth tap point is 50+4(8.24)=82.96/17.04. The simulation shows 82.94/17.06. The error is (82.94−82.96)/82.94=−0.024%.

As can be seen, the various tap points produce a distributed duty cycle, each having a constant, or nearly a constant fraction of the difference between the incoming signal's duty cycle and the final stage's duty cycle. Hence, multiple concurrently available duty cycles are available, each with a known and precise value.

In summary, the present invention provides concurrent multiple available duty cycle tap point outpoints with precision from an output source having any duty cycle. The tap point duty cycles are evenly divided between the known duty cycle associated with the output of the first duty cycle generator and the last stage of the second duty cycle generator. Careful choice of the number of stages of each duty cycle generator, the selected duty cycles of duty cycle generators 1 and 2, and the number of tap points used in duty cycle generator 2 provides the user with numerous combinations of multiple, concurrent, and programmable duty cycles. The use of this approach enables many of the attributes discussed in Ser. No. 09/542,189.

While several embodiments and variations of the present invention for multiple duty cycle tap points for a precise and programmable duty cycle generator are described in detail herein, it should be apparent that the disclosure and teachings of the present invention will suggest many alternative designs to those skilled in the art.

Having thus described our invention, what we claim as new, and desire to secure by Letters Patent is:

1. A programmable circuit for generating a plurality of output clock signals, each having a different desired duty cycle, comprising:
    a first duty cycle generator for converting an input clock signal of unknown duty cycle to a known and programmable duty cycle;
    a second programmable duty cycle generator connected in series with the output of the first duty cycle generator, and providing multiple tap point output signals, each with a known and precise duty cycle value.

2. The circuit of claim 1, wherein the second duty cycle generator comprises:
    an operational amplifier for comparing an analog voltage representing the desired duty cycle with an analog feedback voltage, and generating an output control signal in response thereto;
    a voltage controlled duty cycle generator, responsive to the output control signal of the operational amplifier and having an input clock signal, for generating an output clock signal having the desired duty cycle, wherein the voltage controlled duty cycle generator comprises a plurality of stages; and
    a low pass filter, responsive to the output clock signal, for measuring the duty cycle of the output clock signal and for generating the analog feedback voltage for the operational amplifier, thereby providing a closed feedback loop operation.

3. The circuit of claim 2, wherein the second duty cycle generator comprises:
    an n-bit digital to analog converter for converting a digitally encoded desired duty cycle into the analog voltage.

4. The circuit of claim 2, wherein the first duty cycle generator comprises:
    an operational amplifier for comparing an analog voltage representing the desired duty cycle with an analog feedback voltage, and generating an output control signal in response thereto;
    a voltage controlled duty cycle generator, responsive to the output control signal of the operational amplifier and having an input clock signal, for generating an output clock signal having the desired duty cycle, wherein the voltage controlled duty cycle generator comprises a plurality of stages; and
    a low pass filter, responsive to the output clock signal, for measuring the duty cycle of the output clock signal and for generating the analog feedback voltage for the operational amplifier, thereby providing a closed feedback loop operation.

5. The circuit of claim 4, wherein the first duty cycle generator comprises:
    an n-bit digital to analog converter for converting a digitally encoded desired duty cycle into an analog voltage.

6. The circuit of claim 1, including a buffer at each tap point output to isolate the output load from the internal circuit of the second duty cycle generator.

7. The circuit of claim 6, wherein the duty cycle offset due to each buffer is compensated for by the insertion of a like buffer in the feedback loop.

8. The circuit of claim 3, wherein the second duty cycle generator includes a register for storing a set of register bits representative of the digitally encoded desired duty cycle which provides an input to the digital to analog converter.

9. The circuit of claim 5, wherein the first duty cycle generator includes a register for storing a set of register bits representative of the digitally encoded desired duty cycle and providing an input to the digital to analog converter.

10. The circuit of claim 4, wherein each operational amplifier comprises an operational transconductance amplifier for generating an output current proportional to a difference of its input voltages; and
    a capacitor for receiving the generated output current and for charging or discharging the capacitor to produce a voltage across the capacitor which controls the voltage controlled duty cycle generator.

11. The circuit of claim 4, wherein the output of each digital to analog converter is applied to a noninverting input of the operational amplifier, and the output of the low pass filter is applied to an inverting input of the operational amplifier, such that the voltage controlled duty cycle generator inverts the clock signal to produce the output clock signal.

12. The circuit of claim 4, wherein each voltage controlled duty cycle generator comprises a plurality of stages, each of which comprises a current starved inverter, comprised of PFET current sources and NFET current sources followed by a series inverter which presents a capacitive load to the current sources, to provide either additive or subtractive duty cycle corrections, the plurality of current starved inverters being controlled by the output control signal voltage of the operational amplifier which is connected to both the PFET current sources and the NFET current sources, and as the output control voltage increases, the PFET current sources provide a smaller current to charge the capacitive load, and the NFET current sources provide a larger current to discharge the capacitive load, such that the output waveform has a slow rising edge and a fast falling edge, and the difference in edge rates causes the output of the inverter to have a longer falling delay than a rising delay to produce a duty cycle that is controlled by the output control signal voltage of the operational amplifier.

13. The circuit of claim 12, wherein each plurality of stages is followed by an inverter.

14. The circuit of claim 4, wherein each low pass filter comprises an RC low pass filter.

* * * * *